(12) United States Patent
Dai et al.

(10) Patent No.: US 7,585,721 B2
(45) Date of Patent: Sep. 8, 2009

(54) PROCESS AND APPARATUS FOR FABRICATING NANO-FLOATING GATE MEMORIES AND MEMORY MADE THEREBY

(75) Inventors: Jiyan Dai, Kowloon (HK); Xubing Lu, Kowloon (HK); Pui-Fai Lee, Kowloon (HK)

(73) Assignee: The Hong Kong Polytechnic University, Hong Kong SAR (CN)

( * ) Notice: Subject to any disclaimer, the term of this patent is extended or adjusted under 35 U.S.C. 154(b) by 444 days.

(21) Appl. No.: 11/124,379

(22) Filed: May 9, 2005

(65) Prior Publication Data

US 2006/0252202 A1  Nov. 9, 2006

(51) Int. Cl.
*H01L 21/8238* (2006.01)

(52) U.S. Cl. .................. 438/211; 438/478; 977/773; 257/201

(58) Field of Classification Search .......... 977/773; 438/478, 301, 211, 257, 593; 257/E29.129
See application file for complete search history.

(56) References Cited

U.S. PATENT DOCUMENTS

| | | | |
|---|---|---|---|
| 6,297,095 B1 | 10/2001 | Muralidhar et al. | 438/257 |
| 6,313,015 B1* | 11/2001 | Lee et al. | 438/478 |
| 6,344,403 B1 | 2/2002 | Madhukar et al. | 438/503 |
| 6,448,545 B1 | 9/2002 | Chen | 250/214 |
| 6,487,112 B1 | 11/2002 | Wasshuber | 365/163 |
| 6,723,606 B2* | 4/2004 | Flagan et al. | 438/264 |
| 2004/0046130 A1* | 3/2004 | Rao et al. | 250/492.1 |

OTHER PUBLICATIONS

Botti et al., "Particle size control and Optical Properties of Laser-synthesized silisocn nanopoweders," Allipied Organomettallic Chemistry, 12, 361-365, 1998.*

* cited by examiner

*Primary Examiner*—Jack Chen
*Assistant Examiner*—Matthew Reames
(74) *Attorney, Agent, or Firm*—Jacobson Holman PLLC

(57) ABSTRACT

In a process for fabricating a nano-floating gate memory structure, a substrate and a nanocluster source are firstly provided. The nanocluster source is activated for generating a beam of nanoclusters towards the substrate, and at least part of the nanoclusters are received atop the substrate. Thereby, a plurality of nanoclusters of controllable size are formed atop the substrate.

14 Claims, 2 Drawing Sheets

PROCESS AND APPARATUS FOR FABRICATING NANO-FLOATING GATE MEMORIES AND MEMORY MADE THEREBY

BACKGROUND

1. Field of the Invention

The present invention relates generally to semiconductor technologies, and more particularly to technologies for fabricating nano-floating gate memories and to the memories made thereby.

2. Background of the Invention

Currently, commercial nonvolatile floating gate memory devices use a continuous poly-Si floating gate and a thick $SiO_2$ tunnel oxide to achieve ten-year retention time, resulting in high programming voltage, and slow programming speed. The advantage of a silicon-oxide-nitride-oxide-silicon (SONOS) structure, in which charges are stored in the nitride layer, is that it can operate at lower operating voltages than a continuous floating gate device. Another advantage of SONOS over the continuous floating gate device is the ease of processing due to its simpler layer structure. One problem that exists with the SONOS structure is the retention of the trapping layer at relatively higher temperatures.

By using isolated quantum dots (nanoclusters) instead of continuous floating gate and SONOS structure as charge storage nodes, local defect related leakage can be reduced efficiently to improve data retention. The memory node of nanocluster floating gate (nano-floating gate) memory includes multiple or single silicon nanocluster dots. The multiple floating dots are separated and independent, and electrons or holes are injected into the dots via different paths. The problem of endurance and retention can be greatly improved by such nano-floating gate memories. However, it may still be difficult to fabricate uniform and self-organized nanoclusters of Si, Ge, or $S_xGe_{1-x}$(SiGe). Most of the methods, including the chemical vapors deposition (CVD) and the ion implantation etc, require annealing at high temperatures.

Many fabricating techniques have been proposed to produce the semiconductor quantum dots floating gate including chemical or physical vapor depositing of a thin layer of the semiconductor materials followed by thermal annealing that lead to formation of separated quantum dots. Such examples include U.S. Pat. No. 6,297,095, entitled "Memory Device that Includes Passivated Nanoclusters and Method for Manufacture," and U.S. Pat. No. 6,344,403, entitled "Memory Device and Method for Manufacture," both filed by Muralidhar et al. on Jun. 16, 2000 and assigned to Motorola Inc. These two patents are herein incorporated by reference.

However, the main challenge for the currently used approaches is the difficulty of fabricating size-uniformed and size-controllable nanoclusters of the floating gate materials which are usually Si, Ge or SiGe. Conventional methods such as co-deposition of Ge or Si with dielectric materials such as $SiO_2$ or other high dielectric constant (high-k) materials of $HfO_2$ etc may result in nonuniform and non-controllable nanocluster size.

OBJECT OF THE INVENTION

Therefore, it is an object of the present invention to provide nano-floating gate memories, whose nanoclusters size can be better controlled, and process and apparatus for manufacture thereof, or at least provide the public with a useful choice.

SUMMARY OF THE INVENTION

According to an aspect of present invention, in a process for fabricating a nano-floating gate memory structure, a substrate and a nanocluster source are firstly provided. The nanocluster source is activated for generating a beam of nanoclusters towards the substrate, and at least part of the nanoclusters are received atop the substrate. Thereby, a plurality of nanoclusters of controllable size are formed atop the substrate.

According to a second aspect of the present invention, a process for fabricating a nano-floating gate memory structure includes providing a substrate;

providing a nanocluster source;

activating the nanocluster source for generating a plurality of nanoclusters;

directing at least part of the nanoclusters to generate a nanocluster beam towards the substrate; and receiving at least part of the nanoclusters of the beam atop the substrate, whereby a plurality of nanoclusters of controllable size are formed atop the substrate.

According to a third aspect of the present invention, an apparatus for fabricating a nano-floating gate memory structure includes:

a high or ultrahigh vacuum chamber, in which a substrate can be placed for fabricating the nano-floating gate memory structure thereon, the chamber being at a first air pressure;

a nanocluster source in connection with the chamber, the nanocluster source being at a second air pressure substantially higher than the first air pressure; and wherein the nanocluster source can be activated for generating a plurality of nanoclusters, wherein at least part of the nanoclusters are directed towards the chamber due to the air pressure difference between the nanocluster source and the chamber for generating a nanocluster beam towards the substrate, and wherein at least part of the nanoclusters of the beam are received by the substrate such that a plurality of nanoclusters of controllable size are formed atop the substrate.

According to a further aspect of the present invention, a nano-floating gate flash memory includes a substrate;

a first dielectric layer over the substrate;

a plurality of nanoclusters deposited on the first dielectric layer by the steps of:

providing a nanocluster source;

activating the nanocluster source for generating a plurality of nanoclusters;

directing at least part of the nanoclusters to generate a nanocluster beam towards the substrate; and receiving at least part of the nanoclusters of the beam atop the substrate, whereby a plurality of nanoclusters of controllable size are formed atop the substrate;

a second dielectric layer formed over the nanoclusters; and a conductive layer over the second dielectric layer.

Other aspects and advantages of the invention will become apparent from the following detailed description, taken in

DETAILED DESCRIPTION

Figure 1:
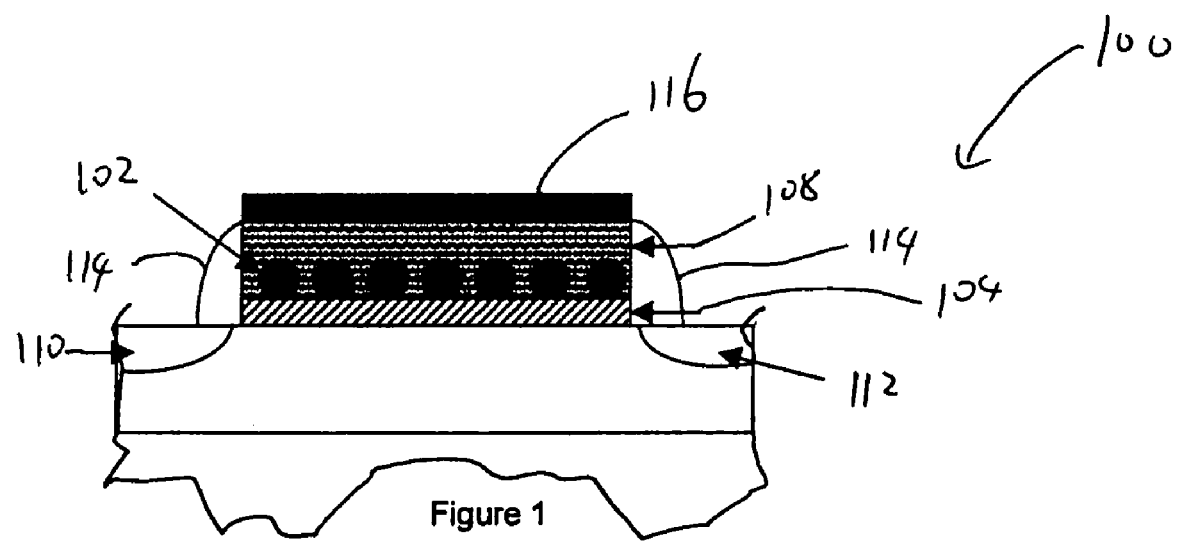
FIG. 1 is a cross-sectional view of a nano-floating gate flash memory structure according to an exemplary embodiment of the present invention.

FIG. 1 illustrates an exemplary nano-floating gate memory 100 according to an embodiment of the present invention. The memory 100 has a layer of nanoclusters 102 sandwiched between a pair of dielectric layers, i.e., a tunnel oxide layer 104 atop a substrate 106 of silicon and a control or capping oxide layer 108. The memory 100 also has a conductive layer 116 atop the capping layer 108 as generally understood in the art.

The nanoclusters 102 are generally in a ball shape as shown in FIG. 1 in the exemplary embodiment and are of at least substantially uniformed size of approximately 3-10 nm. In the exemplary embodiment, nanoclusters of germanium (Ge) are used. However, as could be appreciated by the people in the field, nanoclusters of Si, Ge, $Si_xGe_{1-x}$, or a combination thereof can be used. Desired nanocluster densities up to $10^{12}$-$10^{13}/cm^2$ can be achieved by the time of deposition.

Typically, the tunnel oxide layer 104 is $SiO_2$, nitrided $SiO_2$, other high-k dielectrics such as $HfO_2$, or any other dielectric material. The tunnel oxide layer 104 can be formed by high or ultrahigh vacuum deposition techniques such as chemical vapor deposition (CVD), physical vapor deposition (PVD), and preferably has a thickness less than 50 Angstroms. The capping oxide layer 108 is the same dielectrics as the tunnel layer but with a thickness of around 100 Angstroms.

In addition, as shown in FIG. 1, source 110, drain 112 and spacer 114 have been formed to form a transistor structure by complementary metal-oxide-semiconductor (CMOS) process as generally understood in the art.

Figure 2:
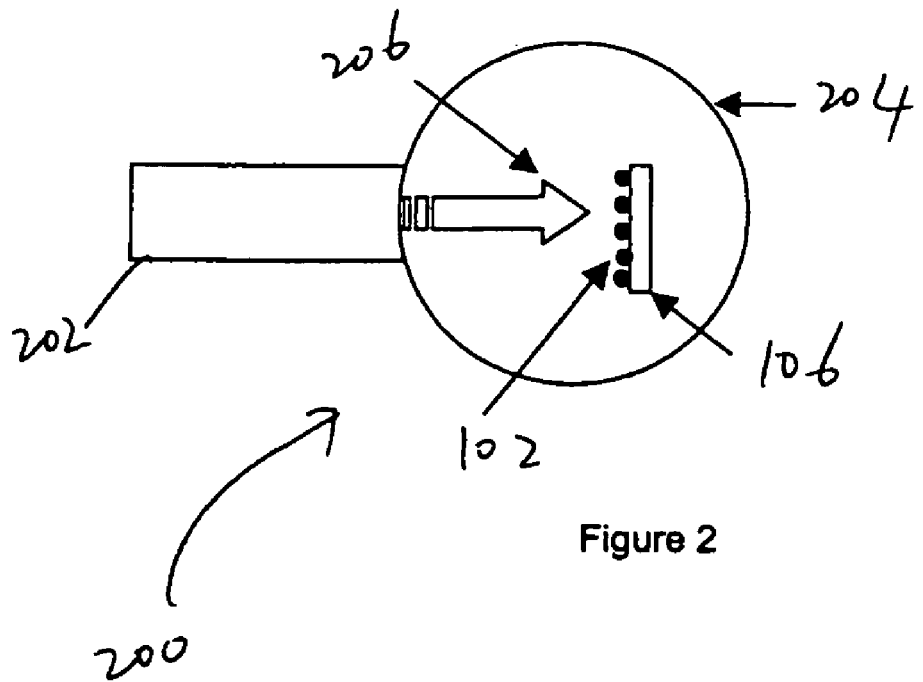
FIG. 2 is a diagram illustrating an exemplary apparatus of the present invention for fabricating the nano-floating gate memory structure of FIG. 1.

Referring to FIGS. 1 and 2, an apparatus 200 for fabricating the nano-floating gate memory 100 basically includes a nanocluster source 202 and a growth chamber 204, which are in connection to each other. In a process of fabricating the nano-floating gate memory, a substrate 106 is placed inside the growth chamber 204, and firstly the tunnel oxide layer 104 (not shown in FIG. 2) is deposited over the substrate inside the growth chamber 204.

Subsequently, in the exemplary embodiment, a Ge nanocluster beam is directed from the nanocluster source 202 through the growth chamber 204 towards the substrate. As the Ge nanoclusters 314 (see FIG. 3) of the nanocluster beam 206 land on the tunnel oxide layer 104 atop the substrate 106, Ge nanoclusters are formed thereon. By rotating the substrate 106 as generally understood in the art, the Ge nanocluster layer 102 can thereby be formed uniformly. Afterwards, the capping oxide layer 108 can be formed over the Ge nanocrystal layer 102 in the same growth chamber 204 as could be understood in the art.

Figure 3:
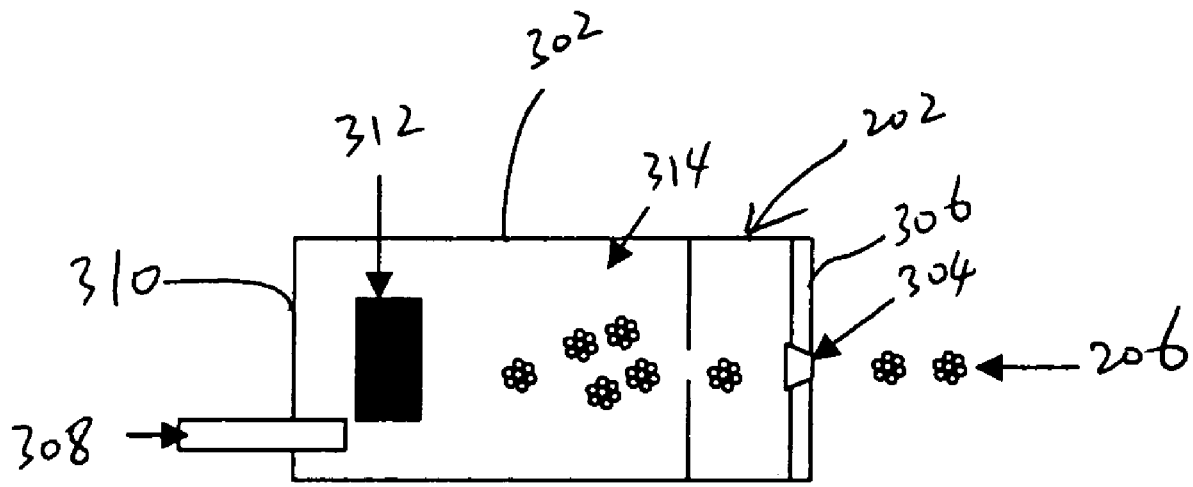
FIG. 3 is a diagram illustrating in detail the nanocluster source of FIG. 2.

Referring to FIG. 3, the nanocluster source 202 mainly includes a source chamber 302 having an aperture 304 on one side 306, which is in connection with the growth chamber 204 (not shown in FIG. 3). An inlet 308 is provide on the other side 310 opposite to side 306 to supply rare gas of Ar to the source chamber 302. Furthermore, in the exemplary embodiment, a Ge target 312 is placed inside the source chamber 302 for generating nanoclusters 314.

In the exemplary embodiment, the target 312 is activated by using a magnetron sputter (not shown) such that a plurality of nanoclusters 314 are generated inside the source chamber 302. It could be understood that various mechanisms can be used to activate the nanocluster target 312, for example, radio frequency sputtering, thermal activation, and laser ablation.

The rare gas Ar functions to sputter the target 312 and to cool the sputtered atoms and clusters 314 inside the source chamber 302. Furthermore, in the exemplary embodiment, the rare gas may include He as well for the purpose of reducing or controlling the nanoclusters size.

Furthermore, in the exemplary embodiment, the air pressure of the growth chamber 204 is lower than approximately $10^{-6}$ torr, and the one of the source chamber 302 is approximately a few to a few tens of mtorr. Such a difference in the air pressures extracts a plurality of nanoclusters 314 through the aperture 304, to form the nanocluster beam 206 into the growth chamber 204, and towards the substrate 106, which is placed opposite to the aperture 304 in the exemplary embodiment.

As understood in the art, the nanoclusters formed on the substrate can be in amorphous or crystallized structure dependent upon the substrate temperature. For example, at room temperature, the nanoclusters thus formed are amorphous structure. If the substrate is heated to, for example, 500 degrees centigrade or higher, the nanoclusters are in crystallized structure, or in other words, nanocrystals are formed on the substrate.

As understood in the art, the nanoclusters size can be varied or controlled by adjusting various parameters such as the power supplied to the sputtering, the size of the aperture 304, the rate of the rare gas, the ratio of He in the rare gas, the temperature of the source chamber, the spacing between the target 312 and the aperture 304, and so on. Furthermore, a filter such as a quadruple mass analyzer (not shown) can be placed approximately between the aperture 304 and the substrate 106 to substantially improve uniformity of the nanoclusters size.

What is claimed is:

1. A process for fabricating a nano-floating gate flash memory structure, comprising providing a substrate in a high or ultrahigh vacuum chamber of a first air pressure, which is lower than about $10^{-6}$ torr;

providing a nanocluster source having a nanocluster target contained therein, the nanocluster target being Ge and the nanocluster source being at a second air pressure substantially higher than the first air pressure;

providing rare gas of Ar and He to the nanocluster source;

activating the nanocluster target for generating a plurality of nanoclusters;

directing at least part of the nanoclusters through an aperture at the nanocluster source to generate a nanocluster beam due to the air pressure difference between the nanocluster source and the chamber; and receiving at least part of the nanoclusters of the beam atop the substrate in the chamber, whereby a plurality of nanoclusters of controllable size of approximately 3 to 10 nanometers in diameter are formed atop the substrate.

2. The process of claim 1, wherein the step of activating the nanocluster source includes magnetron sputtering of the nanocluster target.

3. The process of claim 1, wherein the step of activating the nanocluster source includes radio frequency sputtering of the nanocluster target.

4. The process of claim 1, wherein the step of activating the nanocluster source includes thermally activating the nanocluster target.

5. The process of claim 1, wherein the step of activating the nanocluster source includes laser ablation of the nanocluster target.

6. The process of claim 1, further comprising controlling the size of the nanoclusters formed on the substrate by controlling the aperture size.

7. The process of claim 1, further comprising controlling the size of the nanoclusters generated by the nanocluster source by controlling the temperature of the nanocluster source.

8. The process of claim 1, further comprising controlling the size of the nanoclusters formed on the substrate by controlling a spacing between the target and the aperture.

9. The process of claim 1, further comprising controlling the size of the nanoclusters generated by the nanocluster source by controlling the ratio of He to Ar.

10. The process of claim 1, further comprising
   forming a first dielectric layer over the substrate;
   forming the nanoclusters over the first dielectric layer; and
   forming a second dielectric layer over the nanoclusters.

11. The process of claim 1, wherein the nanoclusters are at least substantially ball shaped.

12. The process of claim 1, wherein the nanoclusters are in amorphous structure.

13. The process of claim 1, further comprising heating the substrate to a predetermined degree to form nanocrystals thereon.

14. The process of claim 1, further comprising filtering the nanocluster beam before the nanoclusters reaches the substrate.

* * * * *

UNITED STATES PATENT AND TRADEMARK OFFICE
CERTIFICATE OF CORRECTION

PATENT NO. : 7,585,721 B2  Page 1 of 1
APPLICATION NO. : 11/124379
DATED : September 8, 2009
INVENTOR(S) : Dai et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 713 days.

Signed and Sealed this

Fourteenth Day of September, 2010

David J. Kappos
*Director of the United States Patent and Trademark Office*